(12) United States Patent
Yen

(10) Patent No.: US 11,404,454 B2
(45) Date of Patent: *Aug. 2, 2022

(54) IMAGE SENSING DEVICE

(71) Applicant: GUANGZHOU LUXVISIONS INNOVATION TECHNOLOGY LIMITED, Science City (CN)

(72) Inventor: Shih-Chieh Yen, New Territories (HK)

(73) Assignee: GUANGZHOU LUXVISIONS INNOVATION TECHNOLOGY LIMITED, Science City (CN)

( * ) Notice: Subject to any disclaimer, the term of this patent is extended or adjusted under 35 U.S.C. 154(b) by 162 days.

This patent is subject to a terminal disclaimer.

(21) Appl. No.: 16/789,957

(22) Filed: Feb. 13, 2020

(65) Prior Publication Data
US 2020/0328239 A1 Oct. 15, 2020

(30) Foreign Application Priority Data

Apr. 11, 2019 (TW) ................................. 108112764

(51) Int. Cl.
| | | |
|---|---|---|
| *H01L 27/146* | (2006.01) | |
| *H04N 5/225* | (2006.01) | |
| *G02B 7/02* | (2021.01) | |
| *G02B 13/00* | (2006.01) | |
| *H04M 1/02* | (2006.01) | |

(52) U.S. Cl.
CPC .. *H01L 27/14603* (2013.01); *H01L 27/14621* (2013.01); *H01L 27/14627* (2013.01); *H01L 27/14645* (2013.01); *H01L 27/14683* (2013.01); *G02B 7/02* (2013.01); *G02B 7/021* (2013.01); *G02B 7/025* (2013.01); *G02B 13/008* (2013.01); *H01L 27/14649* (2013.01); *H04M 1/0264* (2013.01); *H04N 5/2253* (2013.01); *H04N 5/2254* (2013.01)

(58) Field of Classification Search
CPC ........... H01L 27/14683; H04M 1/0264; H04N 5/2253; H04N 5/2254; H04N 5/22587; G02B 7/021; G02B 7/02; G02B 7/025; G02B 13/008
See application file for complete search history.

(56) References Cited

U.S. PATENT DOCUMENTS

| | | | | |
|---|---|---|---|---|
| 9,641,732 B2* | 5/2017 | Yasukochi | ............. | G02B 7/021 |
| 9,726,847 B2* | 8/2017 | An | ......................... | G02B 7/021 |
| 9,733,447 B2* | 8/2017 | Koyama | .............. | H04N 5/2257 |

(Continued)

FOREIGN PATENT DOCUMENTS

| | | |
|---|---|---|
| CN | 108900751 A | 11/2018 |
| TW | I642974 B | 12/2018 |

*Primary Examiner* — David A Zarneke
(74) *Attorney, Agent, or Firm* — Birch, Stewart, Kolasch & Birch, LLP

(57) ABSTRACT

An image sensing device includes a sensing module, a moving module, and an invisible light transmitter. The sensing module includes several pixel sets. Each of the pixel sets includes several sub-pixels and one or more invisible light sensor. The sub-pixels and the invisible light sensor are arranged into an array. The moving module is connected to the sensing module. The moving module is used to move the sensing module. The invisible light transmitter is disposed corresponding to the sensing module. The invisible light sensor is used to sense an invisible light transmitted from the invisible light transmitter.

15 Claims, 8 Drawing Sheets

(56) References Cited

U.S. PATENT DOCUMENTS

| | | | |
|---|---|---|---|
| 10,659,666 B2* | 5/2020 | Lin | G02B 9/04 |
| 2016/0241787 A1* | 8/2016 | Sekimoto | G03B 5/02 |
| 2021/0066383 A1* | 3/2021 | Yen | H01L 27/14667 |

* cited by examiner

IMAGE SENSING DEVICE

CROSS-REFERENCE TO RELATED APPLICATION

This non-provisional application claims priority under 35 U.S.C. § 119(a) to patent application Ser. No. 10/811,2764 in Taiwan, R.O.C. on Apr. 11, 2019, the entire contents of which are hereby incorporated by reference.

BACKGROUND

Technical Field

The instant disclosure relates to an image sensor, and more particular to an image sensing device that can take a three-dimensional image.

Related Art

Currently, a photographing device known to the inventor can take three-dimensional images. The photographing device includes a sensing module. A pixel array and a depth sensor are disposed on the sensing module. The pixel array may receive a visible light to generate a two-dimensional image, and the depth sensor may calculate depth data. The photographing device can generate a three-dimensional image by combining the depth data and the two-dimensional image. For example, an existing depth sensor has two depth light sensing units aligned side-by-side. When a pixel array receives a visible light to obtain data of a two-dimensional image, the two depth light sensing units can receive data of different phases at the same time, and depth data between an object and an imaging plane can be calculated based on a phase difference. In addition, another existing depth sensor has a time of flight (TOF) sensing unit, the time of flight sensing unit may receive an invisible light, and depth data can be calculated according to a difference between times at which the invisible light is received.

SUMMARY

For a photographing device known to the inventor that can take a three-dimensional image, in a technical solution of generating depth data according to the phase difference, accuracy of the depth data is relatively low; in a technical solution of using a time of flight sensing unit, a focusing problem may be caused. Specifically, a pixel array in a sensing module used to receive the visible light and a time of flight sensing unit used for performing the time of flight function are aligned with a lens in a same camera lens. However, the pixel array and the time of flight sensing unit may have different focal points. As a result, when the pixel array is correctly focused to generate a clear two-dimensional image, the time of flight sensing unit may not be correctly focused, resulting in inaccurate depth data. On the other hand, if the time of flight sensing unit is correctly focused, a two-dimensional image corresponding to the pixel array may be a blurred image caused by inaccurate focusing.

In view of the foregoing problems, the instant disclosure and embodiments thereof are proposed below to provide an image sensing device. The image sensing device alleviates inaccuracy of depth data or blurring of an image caused by incorrect focusing.

In one or some embodiments, an image sensing device includes a sensing module, a moving module, and an invisible light transmitter. The sensing module includes a plurality of pixel sets. Each of the pixel sets includes a plurality of sub-pixels and at least one invisible light sensor. The sub-pixels and the invisible light sensor are arranged into an array. The moving module is connected to the sensing module. The moving module is configured to move the sensing module. The invisible light transmitter is disposed corresponding to the sensing module. The invisible light sensor is configured to sense an invisible light transmitted from the invisible light transmitter.

In one or some embodiments, the image sensing device may move the sensing module by the moving module to change the focal length, so that the visible light and the invisible light can be correctly focused to the sub-pixels and the invisible light sensor, respectively, thereby generating a clear two-dimensional image and accurate depth data. In addition, the image sensing device can generate a three-dimensional image quickly and accurately by combining the depth data and the two-dimensional image.

The detailed features and advantages of the instant disclosure are described below in great detail through the following embodiments, the content of the detailed description is sufficient for those skilled in the art to understand the technical content of the instant disclosure and to implement the instant disclosure there accordingly. Based upon the content of the specification, the claims, and the drawings, those skilled in the art can easily understand the relevant objectives and advantages of the instant disclosure. The following embodiments are intended to describe the instant disclosure in further detail, but not intended to limit the scope of the instant disclosure in any way.

BRIEF DESCRIPTION OF THE DRAWINGS

The instant disclosure will become more fully understood from the detailed description given herein below for illustration only, and thus mot limitative of the instant disclosure, wherein;

FIG. 6 to FIG. 14 illustrate schematic views of pixel sets on a sensing module according to embodiments of the instant disclosure.

DETAILED DESCRIPTION

Figure 1:
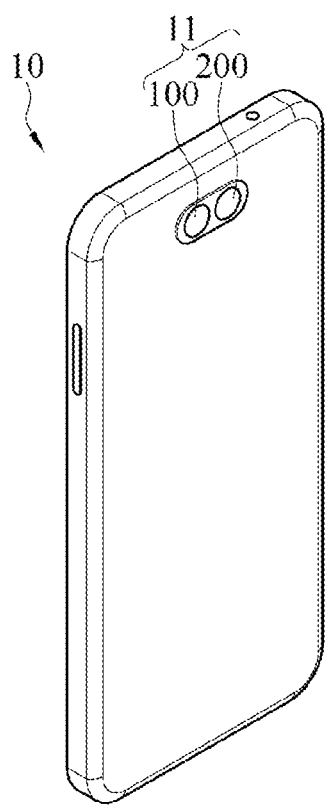
FIG. 1 illustrates a schematic perspective view showing that an image sensing device according to an embodiment of the instant disclosure is applied to a mobile phone.

Referring to FIG. 1, FIG. 1 illustrates a schematic perspective view showing that an image sensing device 11 according to an embodiment of the instant disclosure is applied to a mobile phone 10. As shown in FIG. 1, the mobile phone 10 may be a smart phone, and the image sensing device 11 may be configured to take three-dimensional images. The image sensing device 11 includes a photographing component 100 and an invisible light transmitter 200. The photographing component 100 and the invisible light transmitter 200 are separately disposed on the mobile phone 10 and aligned in a side-by-side manner. However, relative locations of the photographing component 100 and the invisible light transmitter 200 are not limited to this embodiment. In one or some embodiments, the image sensing device 11 may be applied to any electronic devices, such as a driving recorder, a digital camera, or an automatic driving auxiliary device.

Figure 2:
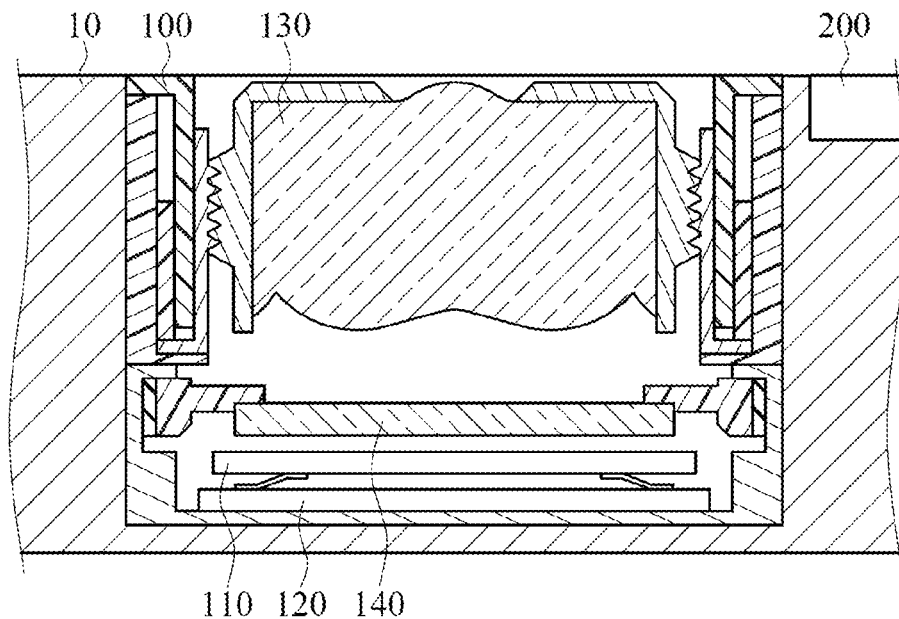
FIG. 2 illustrates a schematic cross-sectional view showing one condition of an image sensing device according to an embodiment of the instant disclosure.
Figure 3:
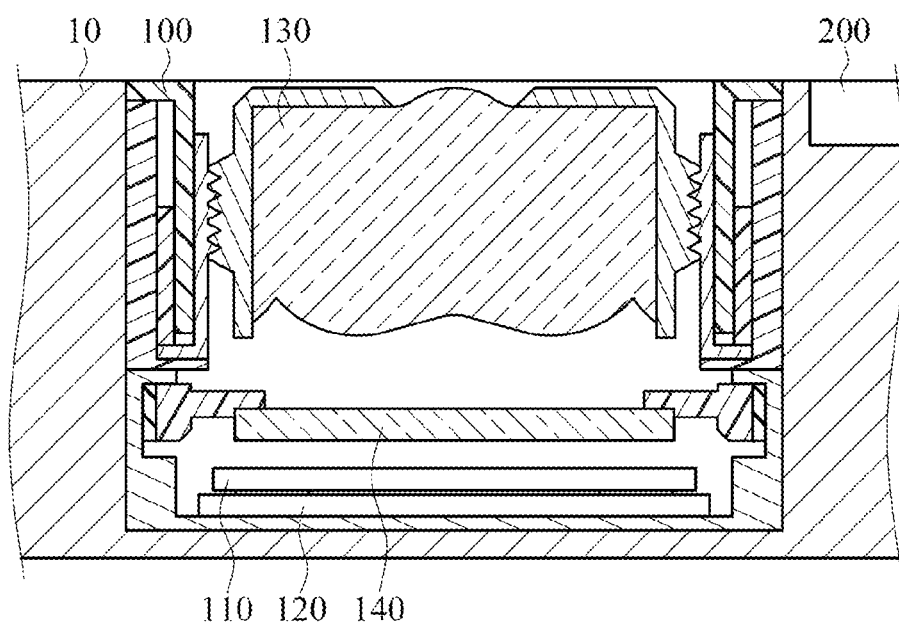
FIG. 3 illustrates a schematic cross-sectional view showing that in another condition the moving module shown in FIG. 2 moves the sensing module.

Referring to FIG. 2 and FIG. 3, FIG. 2 illustrates a schematic cross-sectional view showing that in one condition of the image sensing device 11 in which a moving module 120 moves a sensing module 110, FIG. 2 also illustrates a cross-sectional view of the photographing component 100 and the invisible light transmitter 200 of the image sensing device 11 shown in FIG. 1, and FIG. 3 illustrates a schematic cross-sectional view showing that in another condition of the image sensing device 11 shown in FIG. 2 in which the moving module 120 moves the sensing module 110. The photographing component 100 of the image sensing device 11 includes a sensing module 110 and a moving module 120. The moving module 120 is connected to the sensing module 110, and the moving module 120 may be configured to move the sensing module 110. For example, the moving module 120 can move the sensing module 110, so that the sensing module 110 is relatively moved away from the moving module 120 (shown in FIG. 2). The moving module 120 may also move the sensing module 110 reversely, so that the sensing module 110 is relatively moved to come close to the moving module 120 (shown in FIG. 3). In one or some embodiments, the moving module 120 may include a micro-electromechanical system (MEMS) to move the sensing module 110. For example, the micro-electromechanical system may include a moving member such as a cantilever, a thin film, or a connecting rod, and may include a driving member such as an electromagnetic unit, a voice coil motor, or a stepping motor to drive the moving member to move the sensing module 110, but the instant disclosure is not limited thereto.

As shown in FIG. 2 and FIG. 3, in one or some embodiments, the image sensing device 11 further includes a main lens 130 and a first light filter 140. The sensing module 110 is aligned with the main lens 130 in an axial direction of the main lens 130, and the moving module 120 is configured to move the sensing mode 110 in the axial direction of the main lens 130. The first light filter 140 is located between the main lens 130 and the sensing module 110, and the visible light and the infrared light are capable of passing through the first light filter 140 while light with other wavelengths are filtered by the first light filter 140.

Figure 4:
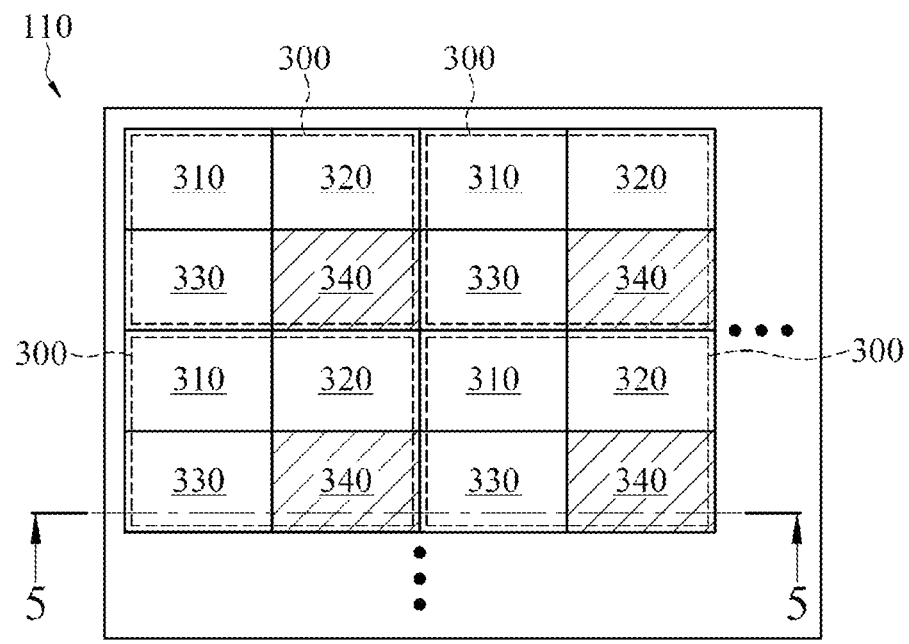
FIG. 4 illustrates a partial schematic top view of a sensing module according to an embodiment of the instant disclosure.

Referring to FIG. 4, FIG. 4 illustrates a partial schematic top view of the sensing module 110 according to an embodiment of the instant disclosure. The sensing module 110 includes a plurality of pixel sets 300, and the pixel sets 300 are arranged into an array on the sensing module 110. It should be understood that, FIG. 4 schematically illustrates just parts of the sensing module 110 and four pixel sets 300 of the pixel sets 300, for illustrative purposes but not a limitation to the instant disclosure. Each of the pixel sets 300 includes a plurality of sub-pixels and at least one invisible light sensor 340, and the sub-pixels in each of the pixel sets 300 and the invisible light sensor 340 are also arranged into an array. In this embodiment, each of the pixel sets 300 includes three sub-pixels and one invisible light sensor 340, and the three sub-pixels in each of the pixel sets 300 are respectively a first color sub-pixel 310, a second color sub-pixel 320, and a third color sub-pixel 330. In each of the pixel sets 300, the first color sub-pixel 310, the second color sub-pixel 320, the third color sub-pixel 330, and the invisible light sensor 340 are arranged into a 2×2 array with two columns and two rows.

As shown in FIG. 1 to FIG. 3, an invisible light transmitter 200 is disposed corresponding to the sensing module 110. The invisible light transmitter 200 can transmit the invisible light, and the invisible light sensor 340 may be configured to sense the reflected invisible light after the invisible light transmitter 200 transmits the invisible light. In this embodiment, the invisible light transmitter 200 is configured to transmit the infrared light, and the invisible light sensor 340 is configured to sense the infrared light. Moreover, the first color sub-pixel 310 is a green sub-pixel for sensing the green light in the visible light, the second color sub-pixel 320 is a blue sub-pixel for sensing the blue light in the visible light, and the third color sub-pixel 330 is a red sub-pixel for sensing the red light in the visible light. In other words, data sensed by the first color sub-pixel 310, the second color sub-pixel 320, and the third color sub-pixel 330 in each of the pixel sets 300 may constitute pixel data (which is also referred to as RGB data), and the pixel data of all pixel sets 300 of the sensing module 110 may constitute a two dimensional color image. Moreover, the image sensing device 11 may calculate, based on a difference between a time at which the invisible light transmitter 200 transmits the infrared light and a time at which the invisible light sensor 340 of each of the pixel sets 300 senses the infrared light, depth data corresponding to each of the pixel sets 300. For example, the invisible light transmitter 200 transmits a specific infrared light at a time point of t0, and the invisible light sensors 340 of the pixel sets 300 respectively sense reflected light of the specific infrared light at time points of t1, t2, t3, etc. Hence, the image sensing device 11 can calculate depth data of each of the pixel sets 300 according to a difference between t1 and t0, a difference between t2 and t0, or a difference between t3 and t0, etc. Last, the image sensing device 11 can generate a three-dimensional color image by combining the pixel data and the depth data of all the pixel sets 300 of the sensing module 110.

Figure 5:
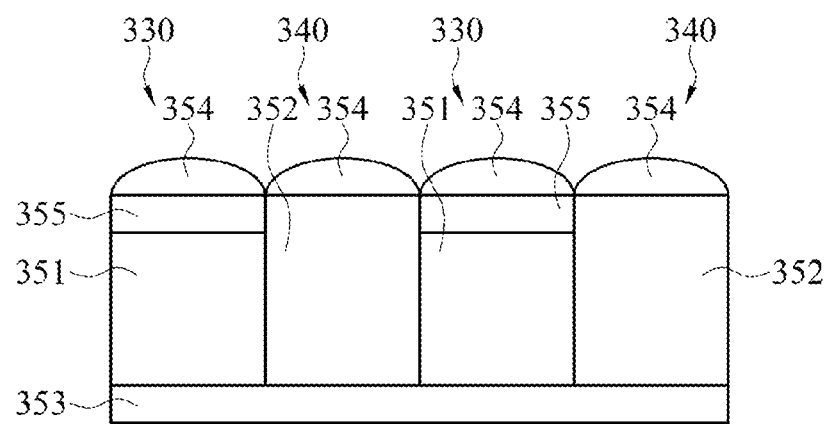
FIG. 5 illustrates a partial schematic cross-sectional view along line 5-5 shown in FIG. 4.

Referring to FIG. 5, FIG. 5 illustrates a partial schematic cross-sectional view along line 5-5 shown in FIG. 4. It should be understood that FIG. 5 schematically illustrates just the main structure of a pixel set 300, for illustrative purposes, but not limitations. In this embodiment, the sensing module 110 further includes a plurality of visible light photodiodes 351, a plurality of invisible light photodiodes 352, a semiconductor layer 353, and a plurality of second light filters 355. The visible light photodiodes 351 and the invisible light photodiodes 352 are arranged on the semiconductor layer 353, the visible light photodiodes 351 and the invisible light photodiodes 352 are respectively electrically connected to corresponding elements and circuits of the semiconductor layer 353, and each of the visible light photodiodes 351 is located between the corresponding second light filter 355 and the semiconductor layer 353. In one or some embodiments, the sensing module 110 may further include microlenses 354. Each of the microlenses 354 is aligned with the corresponding visible light photodiode 351 and the corresponding invisible light photodiode 352, each of the microlenses 354 is located between the first light filter 140 and the corresponding second light filter 355, and each of the microlenses 354 is located between the first light filter 140 and the corresponding invisible light photodiode 352. The microlens 354 is an optional element for increasing the amount of light received by the visible light photodiode 351 and the invisible light photodiode 352. In one or some embodiments, the microlenses 354 are independent elements. For example, the microlenses 354 may be formed on a substrate, and the substrate having the microlenses 354 may be disposed between the first light filter 140 and the pixel sets 300.

The second light filter 355, the visible light photodiode 351, and the corresponding element and circuit of the semiconductor layer 353 may constitute one sub-pixel, and the microlens 354 is aligned with the second light filter 355 of the corresponding sub-pixel. In a case that the visible red, green, or blue light are capable of passing through the second light filter 355 of one sub-pixel, the sub-pixel may be defined as a first color sub-pixel 310, a second color sub-pixel 320, or a third color sub-pixel 330, respectively. Taking the third color sub-pixel 330 as an example, if the second light filter 355 of the third color sub-pixel only allows the visible red light to pass through, the third color sub-pixel 330 is a red sub-pixel. When the visible light and infrared light passing through the first light filter 140 further pass through the microlens 354 and the second light filter 355 of the third color sub pixel 330, only the visible red light enters the visible light photodiode 351. Therefore, the third color sub-pixel 330 generates data corresponding to the red light.

The invisible light photodiode 352 and the corresponding element and circuit of the semiconductor layer 353 may constitute one invisible light sensor 340, and the microlens 354 is aligned with the invisible light photodiode 352 of the corresponding invisible light sensor 340. In this embodiment, the invisible light photodiode 352 can sense only the infrared light, and thus the second light filter 355 does not need to be disposed on the invisible light photodiode 352. When the visible light and infrared light passing through the first light filter 140 further pass through the microlens 354 and enter into the invisible light photodiode 352, the invisible light sensor 340 generates data corresponding to the infrared light.

In the image sensing device 11, external light passes through the main lens 130 to enter the photographing component 100 and passes through the first light filter 140 to be projected onto the sensing module 110; and the sub-pixel for sensing the visible light and the invisible light sensor 340 for sensing the infrared light on the sensing module 110 may sense the projected light and generate corresponding data. However, based on different wavelengths of visible light and infrared light or based on optical or structural differences between the microlenses 354 corresponding to the sub-pixel and the invisible light sensor 340, different optical effects may be generated, resulting in different imaging locations or different focal points. For obtaining a three-dimensional image with more accurate definition of image and more accurate depth data, the moving module 120 may move the sensing module 110 to different locations, to respectively perform focusing to the sub-pixel and the invisible light sensor 340.

For example, it is assumed that the sensing module 110 shown in FIG. 2 is at a first location, and when the sensing module 110 is at the first location, the visible light is focused to the sub-pixels; and the sensing module 110 shown in FIG. 3 is at a second location, and when the sensing module 110 is at the second location, the infrared light is focused to the invisible light sensors 340. The brief procedure for the image sensing device 11 to generate a three-dimensional image is provided as below. When the sensing module 110 is at the first location, the sub-pixels sense the visible light to generate the pixel data, and in this case, the image sensing device 11 can generate a clear two-dimensional color image. Next, the moving module 120 moves the sensing module 110 to the second location, then the invisible light transmitter 200 transmits the infrared light, and the invisible light sensors 340 sense the infrared light to generate the depth data, and in this case, the image sensing device 11 can generate a clear two-dimensional infrared light image. Each of the pixels of the two-dimensional infrared light image has corresponding depth data. The pixel data generated by the sub-pixels of each of the pixel sets 300 is corresponding to the depth data generated by the corresponding invisible light sensor 340. Since the pixel data and the depth data are respectively generated at correct focal points, each of the pixels of the two-dimensional color image may be correctly corresponding to the corresponding pixel and the corresponding depth data of the two-dimensional infrared light image. Therefore, the image sensing device 11 may superimpose the two-dimensional color image on the two-dimensional infrared light image, so that a clear three-dimensional color image with correct depth data can be generated. In one or some embodiments, in a case that the image sensing device 11 is required to generate a three-dimensional image, a two-dimensional infrared light image may be first generated when the sensing module 110 is at the second location, a two-dimensional color image may be generated when the sensing module 110 is then moved to the first location, and thereby the three-dimensional image may be generated.

Refer to FIG. 6 to FIG. 14, FIG. 6 to FIG. 14 illustrate schematic views of pixel sets 300 on a sensing module 110 according to embodiments of the instant disclosure. A difference among the embodiments is the quantity and the arrangement manner of the sub-pixels and invisible light sensors 340 in the pixel sets 300. In one or some embodiments, each of the pixel sets 300 has a plurality of invisible light sensors 340, a plurality of first color sub-pixels 310, a plurality of second color sub-pixels 320, and a plurality of third color sub-pixels 330. The first color sub-pixels 310 and at least one of the invisible light sensors 340 are arranged into an array; the second color sub-pixels 320 and at least one of the invisible light sensors 340 are arranged into an array; and the third color sub-pixels 330 and at least one of the invisible light sensors 340 are arranged into an array.

Figures 6, 7:
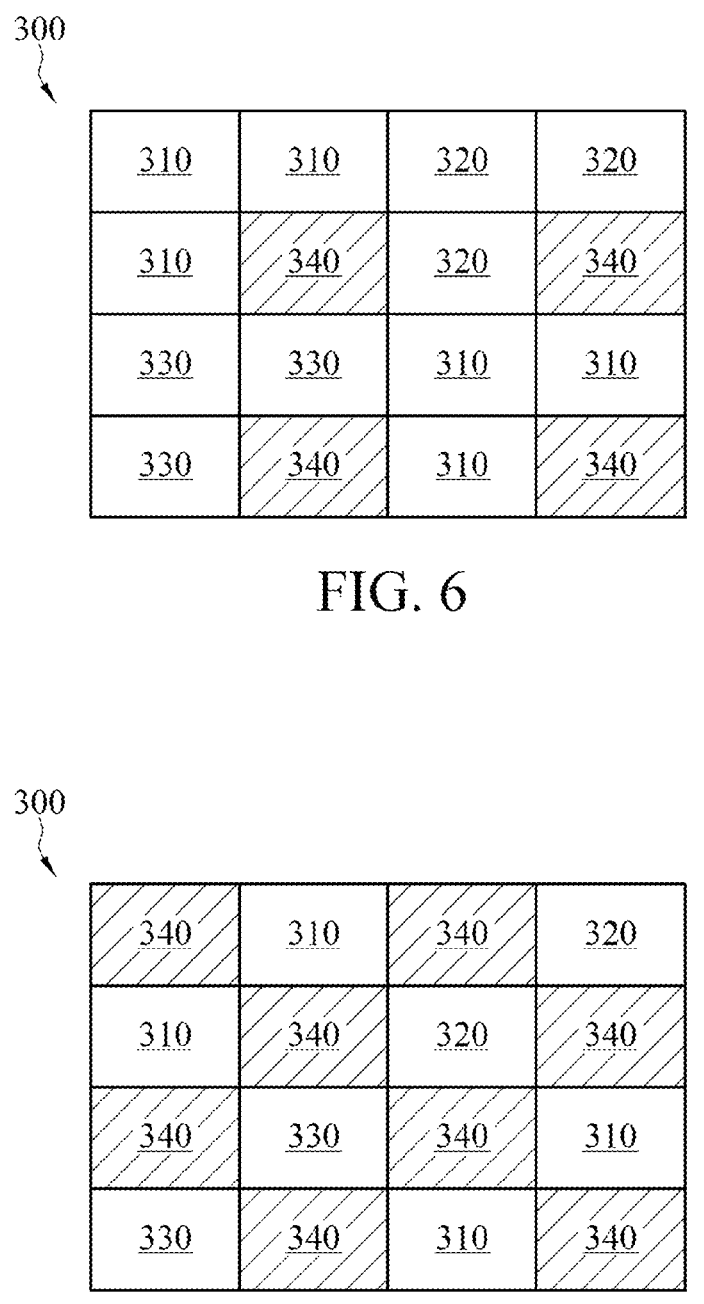

As shown in FIG. 6, in each pixel set 300, four invisible light sensors 340 are provided. The first color sub-pixels 310 are six green sub-pixels, and every three first color sub-pixels 310 and one of the invisible light sensors 340 are arranged into an array with two columns and two rows. The second color sub-pixels 320 are three blue sub-pixels, and the three second color sub-pixels 320 and one of the invisible light sensors 340 are arranged into an array with two columns and two rows. The third color sub-pixels 330 are three red sub-pixels, and the three third color sub-pixels 330 and one of the invisible light sensors 340 are arranged into an array with two columns and two rows. In this embodiment, two sets of 2×2 arrays each having three green sub-pixels and one invisible light sensor 340 are located at a diagonal line of the pixel set 300. In addition, since human eyes are more sensitive to green, a configuration in which the number of the green sub-pixels is greater than the number of the blue sub-pixels or greater than the number of the red sub-pixels may be comparable to human's vision.

Figure 8:
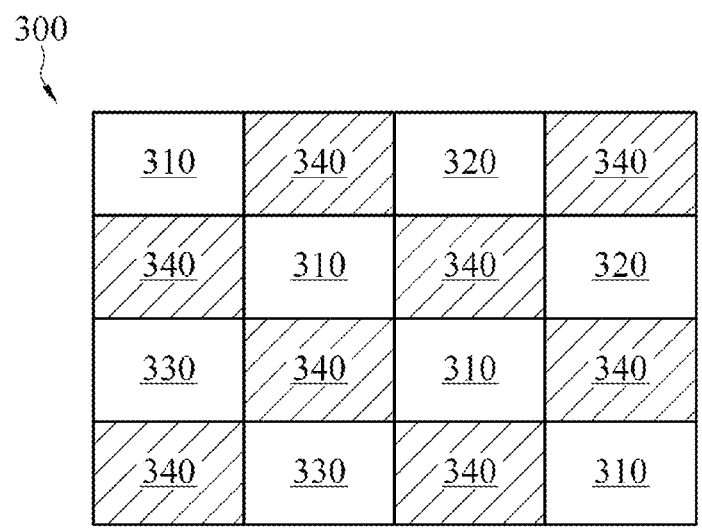

As shown in FIG. 7 and FIG. 8, in each pixel set 300, eight invisible light sensors 340 are provided. The first color sub-pixels 310 are four green sub-pixels, and every two first color sub-pixels 310 and two of the invisible light sensors 340 are arranged into an array with two columns and two rows. The second color sub-pixels 320 are two blue sub-pixels, and the two second color sub-pixels 320 and two of the invisible light sensors 340 are arranged into an array with two columns and two rows. The third color sub-pixels 330 are two red sub-pixels, and the two third color sub-pixels 330 and two of the invisible light sensors 340 are arranged into an array with two columns and two rows. In this embodiment, every two sub-pixels and every two invisible light sensors 340 are respectively located at diagonal lines. A difference between FIG. 8 and FIG. 7 is that locations of each sub-pixel and an adjacent invisible light sensor 340 in FIG. 8 are exchanged, with respect to FIG. 7.

Figure 9:
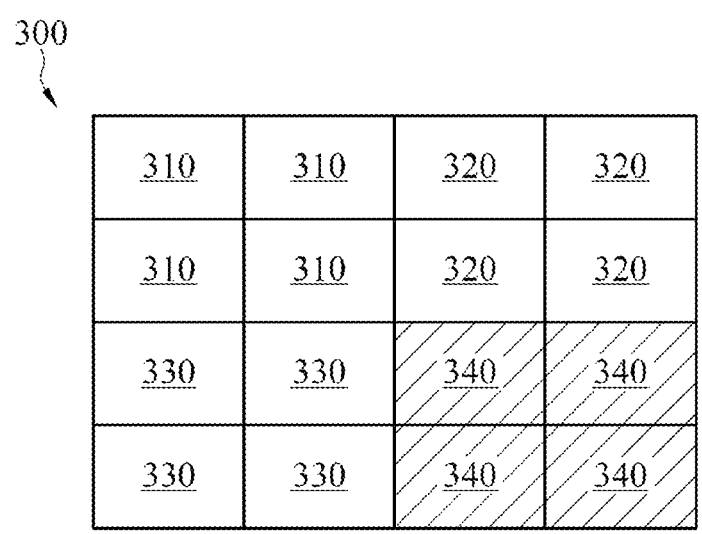

As shown in FIG. 9, in each pixel set 300, four first color sub-pixels 310 are arranged into an array with two columns and two rows, four second color sub-pixels 320 are arranged into an array with two columns and two rows, four third color sub-pixels 330 are arranged into an array with two columns and two rows, and four invisible light sensors 340 are arranged into an array with two columns and two rows.

Figure 10:
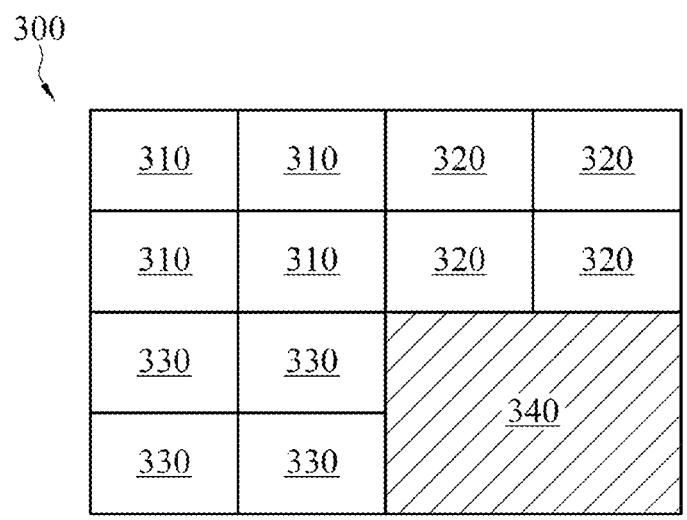

As shown in FIG. 10, in each pixel set 300, four first color sub-pixels 310 are arranged into a first set of array with two columns and two rows, four second color sub-pixels 320 are arranged into a second set of array with two columns and two rows, four third color sub-pixels 330 are arranged into a third set of array with two columns and two rows, and a single invisible light sensor 340 is provided. The first set of array, the second set of array, the third set of array, and the single invisible light sensor 340 are arranged into an array with two columns and two rows. A difference between FIG. 10 and FIG. 9 is that the invisible light sensor 340 in FIG. 10 has a larger size. For example, a width of a sub-pixel is about 1 to 2 microns, a width of a 2×2 array having four sub-pixels is about 2 to 4 microns, and a width of a single invisible light sensor 340 is about 4 to 7 microns. Therefore, three sets of 2×2 array sub-pixels and the single invisible light sensor 340 may be arranged into a 2×2 array pixel set 300.

Figure 11:
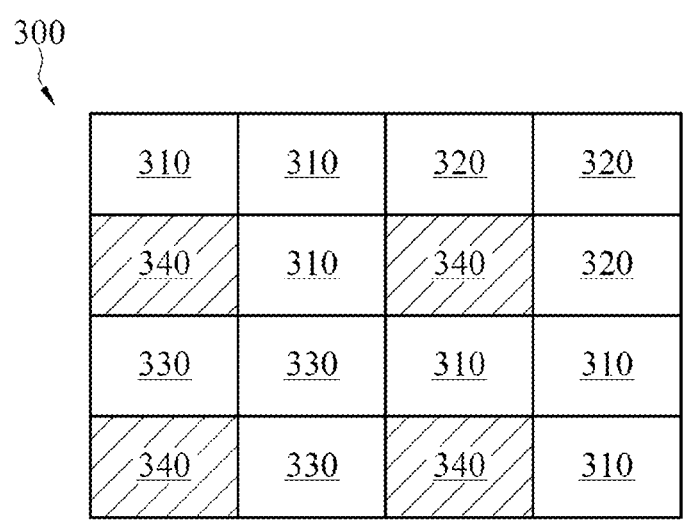
Figure 12:
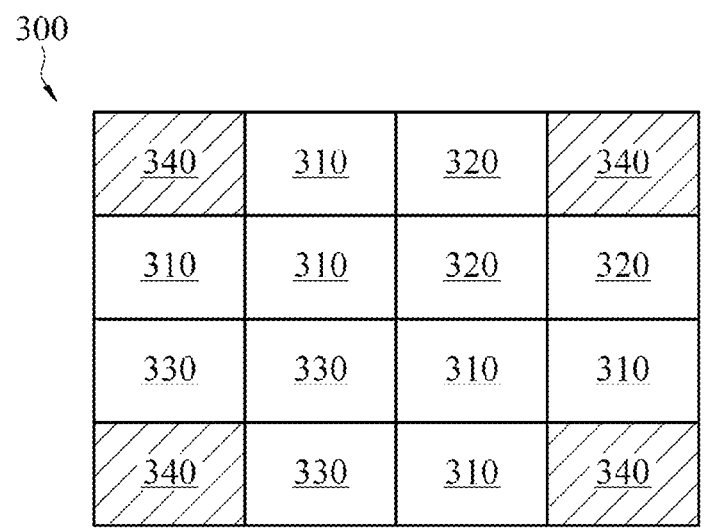
Figure 13:
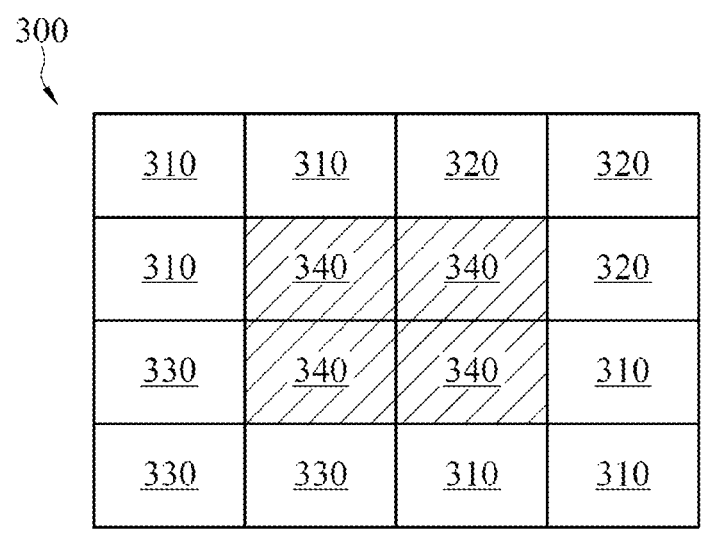

As shown in FIG. 11 to FIG. 13, FIG. 11 to FIG. 13 illustrate variations of the embodiment shown in FIG. 6. A difference between FIG. 11 and FIG. 6 is that, in FIG. 6, for each pixel set 300, the invisible light sensor 340 is located at the lower right corner of the 2×2 array having three sub-pixels and one invisible light sensor 340, and in FIG. 11, for each pixel set 300, the invisible light sensor 340 is located at the lower left corner of the 2×2 array having three sub-pixels and one invisible light sensor 340.

A difference between FIG. 12 and FIG. 6 is that, in FIG. 12, for each pixel set 300, the invisible light sensor 340 is located at an outer side corner of the 2×2 array having three sub-pixels and one invisible light sensor 340. Taking the pixel sets 300 shown in FIG. 12 as a whole, four invisible light sensors 340 are located at the four corners of the pixel sets 300.

A difference between FIG. 13 and FIG. 6 is that, in FIG. 13, for each pixel set 300, the invisible light sensor 340 is located at an inner side corner of the 2×2 array having three sub-pixels and one invisible light sensor 340. Taking the pixel sets 300 shown in FIG. 13 as a whole, four invisible light sensors 340 are located at the middle area of each of the pixel sets 300, and the four invisible light sensors 340 are also arranged into a 2×2 array.

Figure 14:
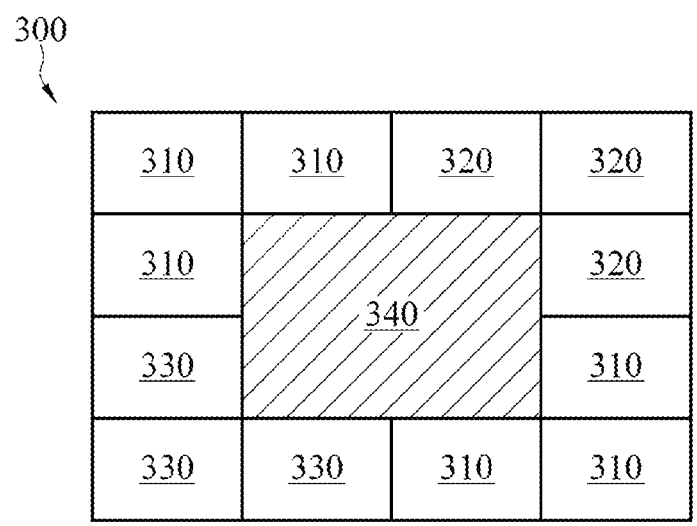

As shown in FIG. 14, a difference between FIG. 14 and FIG. 13 is that in FIG. 14, a single invisible light sensor 340 is located at a middle area of each of the pixel sets 300. In a configuration in which a width of a sub-pixel is less than a width of the invisible light sensor 340, several sub-pixels may be disposed at the periphery of the single invisible light sensor 340 to jointly form one pixel set 300.

In summary, according to one or some embodiments of the instant disclosure, in each of the pixel sets, the invisible light sensor has a focal length different from that of a sub-pixel (the first color sub-pixel, the second color sub-pixel, and the third color sub-pixel). Here, the focal length refers to a focal length between an object to be photographed and each of the sub-pixels and the invisible light sensors. According to the image sensing device provided in the embodiment(s) of the instant disclosure, the image sensing device may move the sensing module by the moving module to change the focal length, so that the visible light and the invisible light can be correctly focused to the sub-pixels and the invisible light sensors respectively, thereby generating a clear two-dimensional image and accurate depth data. In addition, the image sensing device can generate a three-dimensional image quickly and accurately by combining the depth data and the two-dimensional image.

Although the instant disclosure has been described in considerable detail with reference to certain preferred embodiments thereof, the disclosure is not for limiting the scope of the instant disclosure. Persons having ordinary skill in the art may make various modifications and changes without departing from the scope and spirit of the instant disclosure. Therefore, the scope of the appended claims should not be limited to the description of the preferred embodiments described above.

What is claimed is:

1. An image sensing device, comprising:
    a sensing module comprising a plurality of pixel sets, each of the pixel sets comprising a plurality of sub-pixels and at least one invisible light sensor, and the sub-pixels and the invisible light sensor being arranged into an array;
    a moving module connected to the sensing module, the moving module being configured to move the sensing module; and
    an invisible light transmitter disposed corresponding to the sensing module, and the invisible light sensor being configured to sense an invisible light transmitted from the invisible light transmitter.

2. The image sensing device according to claim 1, wherein the sub-pixels of each of the pixel sets comprises a first color sub-pixel, a second color sub-pixel, and a third color sub-pixel.

3. The image sensing device according to claim 2, wherein in each of the pixel sets, the first color sub-pixel, the second color sub-pixel, the third color sub-pixel, and the invisible light sensor are arranged into an array with two columns and two rows.

4. The image sensing device according to claim 2, wherein a plurality of invisible light sensors is configured in each of the pixel sets; the sub-pixels of each of the pixel sets comprises a plurality of first color sub-pixels, and the first color sub-pixels and at least one of the invisible light sensors are arranged into an array; the sub-pixels of each of the pixel sets comprises a plurality of second color sub-pixels, and the second color sub-pixels and at least one of the invisible light sensors are arranged into an array; and the sub-pixels of each of the pixel sets comprises a plurality of third color sub-pixels, and the third color sub-pixels and at least one of the invisible light sensors are arranged into an array.

5. The image sensing device according to claim 4, wherein four invisible light sensors are configured in each of the pixel sets; the first color sub-pixels are six green sub-pixels, and every three of the first color sub-pixels and one of the invisible light sensors are arranged into an array with two columns and two rows; the second color sub-pixels are three blue sub-pixels, and the three second color sub-pixels and one of the invisible light sensors are arranged into an array with two columns and two rows; the third color sub-pixels are three red sub-pixels, and the three third color sub-pixels and one of the invisible light sensors are arranged into an array with two columns and two rows.

6. The image sensing device according to claim 4, wherein eight invisible light sensors are configured in each of the pixel sets; the first color sub-pixels are four green sub-pixels, and every two of the first color sub-pixels and two invisible light sensors are arranged into an array with two columns and two rows; the second color sub-pixels are two blue sub-pixels, and the two second color sub-pixels and two invisible light sensors are arranged into an array with two columns and two rows; and the third color sub-pixels are two red sub-pixels, and the two third color sub-pixels and two invisible light sensors are arranged into an array with two columns and two rows.

7. The image sensing device according to claim 2, wherein in each of the pixel sets, four first color sub-pixels are arranged into an array with two columns and two rows, four second color sub-pixels are arranged into an array with two columns and two rows, four third color sub-pixels are arranged into an array with two columns and two rows, and four invisible light sensors are arranged into an array with two columns and two rows.

8. The image sensing device according to claim 2, wherein in each of the pixel sets, four first color sub-pixels are arranged into a first set of array with two columns and two rows, four second color sub-pixels are arranged into a second set of array with two columns and two rows, four third color sub-pixels are arranged into a third set of array with two columns and two rows, and a single invisible light sensor is provided, wherein the first set of array, the second set of array, the third set of array, and the single invisible light sensor are arranged into an array with two columns and two rows.

9. The image sensing device according to claim 1, wherein when the sensing module is at a first location and the sub-pixels sense a visible light to generate pixel data, the moving module moves the sensing module to a second location, the invisible light transmitter transmits the invisible light, and the invisible light sensor senses the invisible light to generate depth data, wherein the pixel data generated by the sub-pixels of each of the pixel sets correspond to the depth data generated by the invisible light sensor.

10. The image sensing device according to claim 9, wherein when the sensing module is at the first location, the visible light is focused to the sub-pixels; when the sensing module is at the second location, the invisible light is focused to the invisible light sensor.

11. The image sensing device according to claim 10, further comprising a lens, wherein the sensing module is aligned with the lens in an axial direction of the lens, and the moving module is configured to move the sensing module in the axial direction of the lens.

12. The image sensing device according to claim 11, further comprising a light filter and a plurality of microlenses, wherein the light filter is located between the lens and the sensing module, the microlenses are located between the light filter and the pixel sets, and each of the microlenses is aligned with the corresponding sub-pixel and the corresponding invisible light sensor.

13. The image sensing device according to claim 12, wherein the invisible light transmitter is configured to transmit an infrared light, the invisible light sensor is configured to sense the infrared light, and the visible light and the infrared light are capable of passing through the light filter.

14. The image sensing device according to claim 9, wherein the sub-pixels of each of the pixel sets comprises a first color sub-pixel, a second color sub-pixel, and a third color sub-pixel; in each of the pixel sets, four first color sub-pixels are arranged into a first set of array with two columns and two rows, four second color sub-pixels are arranged into a second set of array with two columns and two rows, four third color sub-pixels are arranged into a third set of array with two columns and two rows, and a single invisible light sensor is provided, wherein the first set of array, the second set of array, the third set of array, and the single invisible light sensor are arranged into an array with two columns and two rows.

15. The image sensing device according to claim 13, wherein the sub-pixels of each of the pixel sets comprises a first color sub-pixel, a second color sub-pixel, and a third color sub-pixel; in each of the pixel sets, four first color sub-pixels are arranged into a first set of array with two columns and two rows, four second color sub-pixels are arranged into a second set of array with two columns and two rows, four third color sub-pixels are arranged into a third set of array with two columns and two rows, and a single invisible light sensor is provided, wherein the first set of array, the second set of array, the third set of array, and the single invisible light sensor are arranged into an array with two columns and two rows.

* * * * *